United States Patent
Watanabe et al.

(10) Patent No.: US 8,040,712 B2
(45) Date of Patent: Oct. 18, 2011

(54) INFORMATION MEMORY DEVICE AND MEMORY MEDIUM

(75) Inventors: Takao Watanabe, Fuchu (JP); Toshimichi Shintani, Kodaira (JP); Takeshi Maeda, Koganei (JP); Akemi Hirotsune, Odawara (JP); Yoshitaka Bito, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 385 days.

(21) Appl. No.: 12/314,845

(22) Filed: Dec. 17, 2008

(65) Prior Publication Data

US 2009/0154304 A1 Jun. 18, 2009

(30) Foreign Application Priority Data

Dec. 17, 2007 (JP) ................................ 2007-324176

(51) Int. Cl.
*G11B 11/00* (2006.01)
(52) U.S. Cl. ...... 365/122; 365/127; 365/120; 369/13.02
(58) Field of Classification Search .......... 365/109–114, 365/117–120, 122, 127; 369/13.02
See application file for complete search history.

(56) References Cited

U.S. PATENT DOCUMENTS

| | | | | |
|---|---|---|---|---|
| 3,912,391 A | * | 10/1975 | Fleisher et al. | 355/54 |
| 4,471,470 A | * | 9/1984 | Swainson et al. | 365/127 |
| 5,847,565 A | | 12/1998 | Narayanan | |

FOREIGN PATENT DOCUMENTS

| | | |
|---|---|---|
| JP | 3011378 | 7/1991 |
| JP | 11-102584 | 3/1998 |
| JP | 2007-4325 | 6/2005 |

OTHER PUBLICATIONS

C. P. Slichter, "Principles of Magnetic Resonance", $3^{rd}$ Edition, Springer-Verlag, 1990, Sections 1 and 2, p. 1-59.
Azriel Rosenfeld et al., Digital Picture Processing, vol. 1, Chapter 8, Academic Press Inc., pp. 353-430.

* cited by examiner

*Primary Examiner* — J. H. Hur
*Assistant Examiner* — Hai Pham
(74) *Attorney, Agent, or Firm* — Stites & Harbison PLLC; Juan Carlos A. Marquez, Esq.

(57) ABSTRACT

An information memory device using an electromagnetic-wave resonance phenomenon is provided to achieve both high density and long-period storage of stored data. Memory cells are three-dimensionally arranged in the inside of a solid-like medium which is not contacted with a surface of the medium, and the memory cell has resonance characteristics to electromagnetic waves depending on the space coordinates of the memory cell. For the medium, a material is selected so that an electromagnetic wave having the resonance frequency of the memory cell. By observing absorption spectra of the irradiated electromagnetic wave or emission spectra after the absorption, three-dimensional space coordinates of the memory cell are calculated.

7 Claims, 5 Drawing Sheets

| MM-BASE | CELL |
|---------|------|
| Si, W, etc. | a-Si+H, Ta, Ag, Au, etc. |

US 8,040,712 B2

INFORMATION MEMORY DEVICE AND MEMORY MEDIUM

The present application claims priority from Japanese Patent Application No. JP 2007-324176 filed on Dec. 17, 2007, the content of which is hereby incorporated by reference into this application.

TECHNICAL FIELD OF THE INVENTION

The present invention relates to an information memory device. More particularly, the present invention relates to a technique of reading stored data hermetically sealed in a solid-like medium in a non-contact way, and further relates to a device capable of achieving both high-density data memory and long-period storage by reading three-dimensionally-arranged data as being hermetically sealed.

BACKGROUND OF THE INVENTION

Achievement of high-performance of devices handling digital information such as images and sound has been rapidly advanced, and according to this, achievement of high-integration of information storage devices which store digital information has been notably progressed. Typical storage devices for digital information include semiconductor memories, hard disks, optical discs and others, and they are widely used for memorizing various types of digital information such as music, image, and text. On the other hand, various ideas have been studied to seek a novel memory method. For example, examples of information storage devices using totally different means from those described above are disclosed in Japanese Patent Application Laid-Open Publication No. 2007-4325 (Patent Document 1) and Japanese Patent Application Laid-Open Publication No. H11-102584 (Patent Document 2) described below.

Patent Document 1 discloses an example of an ID card using electron spin resonance.

Patent Document 2 discloses an example of a three-dimensional memory using resonance phenomenon such as nuclear spin put in a magnetic field.

In addition, while respective documents will be described later, there are documents for reference to understand the invention of the present application such as Japanese Patent No. 3011378 (Patent Document 3), C. P. Slichter, "Principles of Magnetic Resonance", 3rd edition, Springer-Verlag, 1990, Sections 1 and 2, p. 1-59 (Non-Patent Document 1), and Azriel Rosenfeld and Avinash C. Kak, "Digital Picture Processing", Second Edition, Volume 1, Academic Press Inc., Section 8, p. 353-430 (Non-Patent Document 2).

DISCLOSURE OF THE INVENTION

A problem to be solved by the present invention lies in an achievement of both a highly-integrated information memory and long-period storage of memory information. Conventional information memory devices such as semiconductor memories, magnetic and optical discs are based on a two-dimensional arrangement of units for storing information. Although there is also an information memory device having stacked memory layers, the number of stacked layers is a few layers. For achieving high integration on the basis of a two-dimensional arrangement, promotion of microfabrication process techniques is inevitably necessary, and thus problems of investments in manufacturing facilities and device variations will be apparent.

Also, from a viewpoint of long-period storage of memory information, the conventional information memory devices may not be sufficient, either. Some semiconductor memory devices such as an optical disc, a hard disk, a flash memory, and the like can store information in non-volatile way even when power is turned off. However, it is said that these devices last for merely ten to several tens of years, and information may be lost in several years depending on the usage.

On the other hand, in a method described in Patent Document 1, a spatially-localized information memory unit does not exist. Therefore, microfabrication thereof is not required. According to Patent Document 1, several types of ferromagnetic materials having different resonance frequencies are prepared, and an arbitrary type of ferromagnetic material is selected therefrom to be mixed in a material and coated on an ID card. To that ID card, an electromagnetic wave is irradiated to identify the type of ferromagnetic material coated on the card based on presence or absence of resonance. The ID card can be identified by a combination of ferromagnetic materials. In this method, since the ferromagnetic material is required to be prepared so that the number of types of ferromagnetic materials corresponds to the amount of information to be stored, this method is not suitable for storing a large amount of information, and Patent Document 1 only discloses an application example for an ID card.

In Patent Document 2, a method using liquid water or solid poly methyl methacrylate as a memory medium are disclosed. In this method, by applying a magnetic field with a three-dimensional gradient to a uniform memory medium such as water, a resonance frequency is controlled and an electromagnetic wave having a locally different frequency is absorbed, so that writing is performed. Reading is performed by reading an electromagnetic wave emitted from a hydrogen atom or the like within a relaxation time of resonance. With the use of three-dimensional space, this method seems to be advantageous to achieve high integration compared to the conventional two-dimensional information storage device. However, this method has a problem of losing the stored information when a relaxation time passes over before reading, an external magnetic field is cut off, or the medium is brought out to an environment without a magnetic field.

As described in the foregoing, according to the conventional information storage devices, it has been difficult to achieve both high integration and long-period information storage. The present invention has been made in consideration of these problems.

The above and other objects and novel characteristics of the present invention will be apparent from the description of this specification and the accompanying drawings.

The typical ones of the inventions disclosed in this application will be briefly described as follows.

At desired positions inside a memory medium which is configured by a solid-like first material, three-dimensionally-distributed small sections are provided. In the small section described above, a second material is hermetically sealed. The second material in each of the small sections is formed so as to absorb electromagnetic waves with different frequencies by changing a shape or a composition thereof depending on a position in the memory medium or by applying a magnetic field or an electric field having a space dependence externally. The first material is selected to be a material having a high transmittance of an electromagnetic wave in a frequency band which the second material absorbs. An electromagnetic wave is externally provided to the abovedescribed memory medium, and a spectrum of the absorbed electromagnetic wave or a spectrum of an emitted electromagnetic wave after absorption is observed. At this time, a frequency of the electromagnetic wave absorbed or emitted reflects space coordinates of the small section, and this is interpreted as an address of the stored data, and presence or absence of absorption/emission are interpreted as '1' or '0' of the data, respectively.

A large capacity memory device can be realized according to the present invention.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings.

Note that, components having the same function are denoted by the same reference symbols throughout the drawings for describing the embodiment, and the repetitive description thereof will be omitted. Also, the drawings and descriptions of the present invention are simplified for the purpose of illustrating components necessary to clearly understand the present invention, and at the same time, for concision, other components considered to be well known are eliminated. It will be understood by those skilled in the art that such other components not illustrated are desirable or necessary to implement the present invention. However, these components are well known in the art and are not helpful for better understanding of the present invention, and therefore descriptions of these components will not be provided in the present specification.

Figure 1:
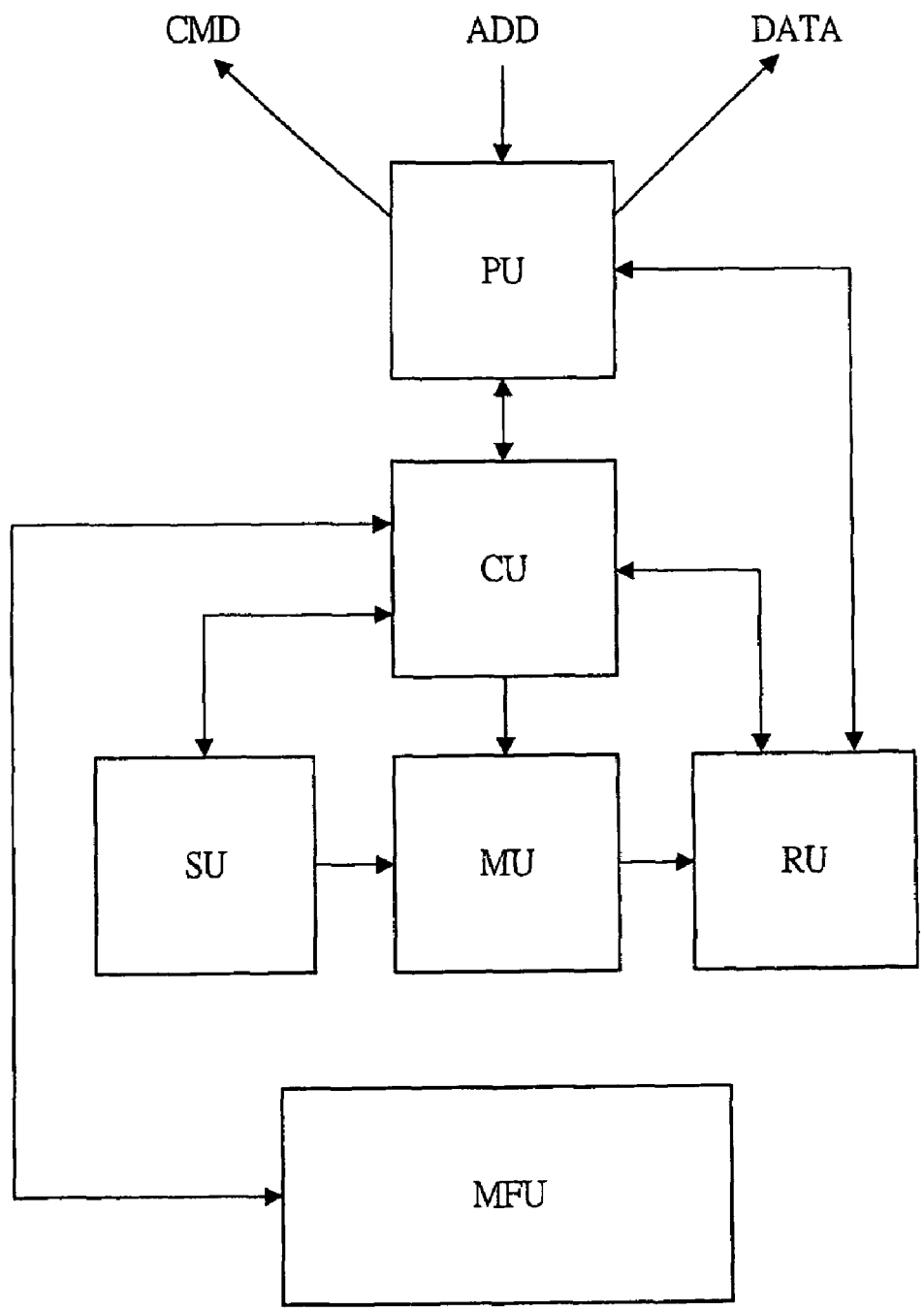
FIG. 1 is a block diagram showing an embodiment of an information memory device according to the present invention.

FIG. 1 shows a first embodiment of an information memory device according to the present invention. Main components (hereinafter, called units) configuring an information processing device of the present invention are shown as a block diagram. Arrows shown in the block diagram indicate flows of data, control signals and the like among respective blocks. "CMD" represents a command signal, "ADD" represents an address, and "DATA" represents data.

In FIG. 1, "MU" represents a memory unit that stores data "DATA" in small sections distinguished by three-dimensional addresses "ADD". "SU" represents a sender unit that transmits an electromagnetic wave to the memory unit "MU". "RU" represents a receiver unit that receives the electromagnetic wave which passes through or is emitted from the memory unit "MU". "PU" represents a processing unit that performs signal processing to a received signal provided from the receiver unit "RU" to calculate an arrangement and a value of data recorded in the memory unit "MU". "MFU" represents a magnetic-field generator unit that applies a necessary magnetic field to the memory unit "MU". "CU" represents a control unit that controls rotation and vertical movement, or tilt etc. of "MU".

In the present embodiment, when a read command and an address are inputted externally to the processing unit "PU", a value of data corresponding to the input address is outputted. A read operation will be specifically described later. Note that, in the following, a generating method of an electromagnetic wave, a magnetic field and an electric field, a receiving method of an electromagnetic wave, and a signal processing such as spectra analysis will be omitted to describe. These are disclosed in textbooks of electrical engineering, and engineers having general knowledge thereof can design necessary equipment.

In the following, first, an embodiment showing a configuration of a memory medium will be described, and then, an embodiment of a reading method will be described. Note that, in an embodiment described below, the memory unit "MU" is configured by a memory medium "MM" shaped in quadrangular prism. Polygonal prisms such as quadrangular prism are hard to roll over, and therefore having an advantage of low risk of falling down when placed on a desk and the like. However, the shape of the memory medium "MM" is not required to be a polygonal prism, and as a matter of course, may be an another shape such as circular cylinder as needed. If the shape is a circular cylinder, for example, since there is no corner on side surface thereof, when stored in a container, there is less interference between the corner on the side surface and the container even if the memory medium is roughly positioned in the container, and therefore, there is an advantage that the memory medium can be easily stored in the container.

Figure 2A:
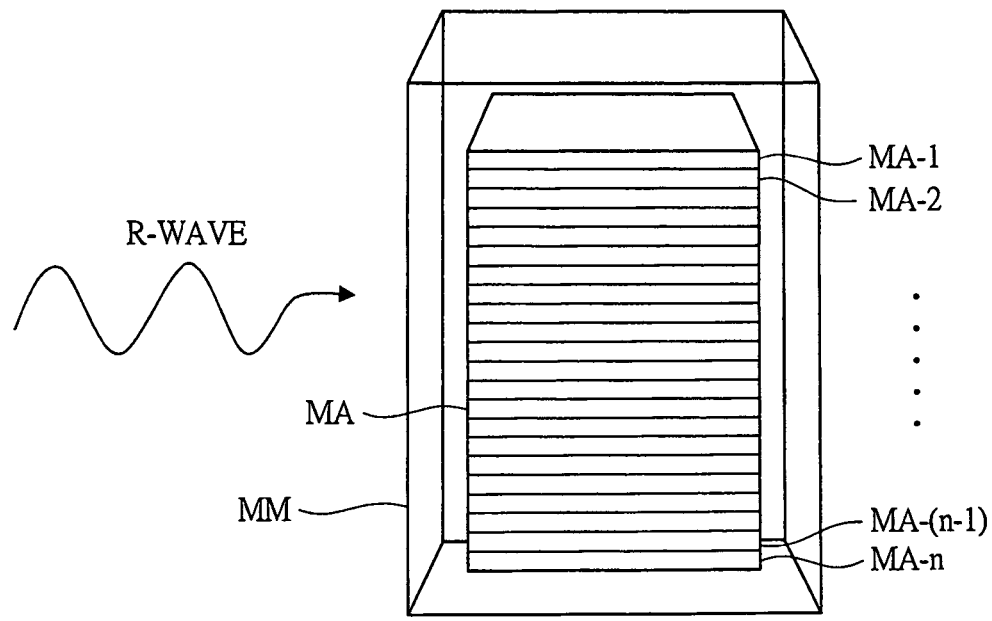
FIG. 2A is a diagram of an embodiment showing a configuration of a memory medium used in the present invention.
Figure 2B:
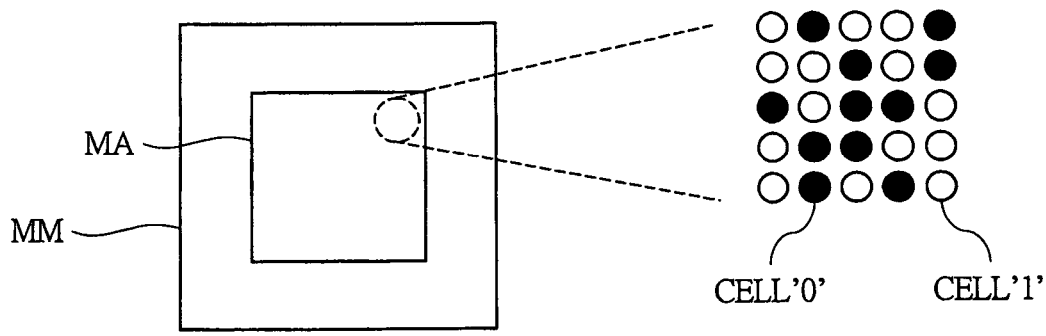
FIG. 2B is a diagram of an embodiment showing a configuration of the memory medium used in the present invention.
Figure 2C:
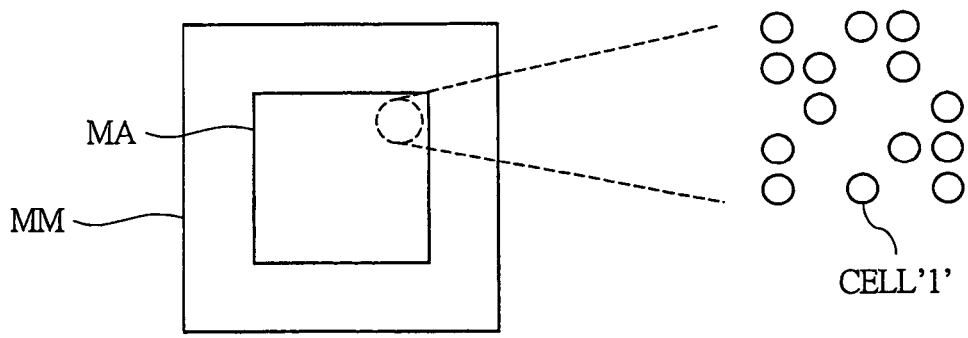
FIG. 2C is a diagram of an embodiment showing a configuration of the memory medium used in the present invention.

FIGS. 2A to 2C are diagrams an embodiments showing specific configurations of the memory unit MU. FIG. 2A shows the memory medium MM and a memory area "MA" provided therein. MA has a multilayer structure with MA-1 to MA-n. FIGS. 2B and 2C are diagrams of embodiments showing configurations of each layer. These diagrams show enlarged views from above of a memory area MA-i. "CELL" represents a memory cell which stores information. The memory cell CELL is arranged at a lattice-like position in each layer of MA. As described below, in the present invention, an electromagnetic wave is irradiated on the memory medium MM, and absorption or emission of the electromagnetic wave by the memory cell inside the memory area MA is observed, thereby reading the stored information.

In FIG. 2B, a memory cell of data '1' is depicted by a white circle, and a memory cell of data '0' is depicted by a black circle. For these cells of data '1' and '0', materials having different characteristics in electromagnetic-wave absorption and emission are used. In the memory medium MM, a material hardly absorb or emit the irradiated electromagnetic wave is selected for a portion except for the memory cells inside the memory area.

In the embodiment of FIG. 2C, a memory cell CELL is arranged only at a position where the data '1' is stored. As for a position corresponding to the data '0', other material than that of the memory cell in FIG. 2B, that is, a material without absorption or emission of the electromagnetic wave exists at a latent position of the memory cell. In the present embodiment, compared to the case shown in FIG. 2B in which two types of materials that are respectively different in characteristics of the electromagnetic-wave absorption or emission with respect to the data '1' and '0' are provided, there is an advantage that a formation of the memory cell portion is facilitated.

Figures 3, 4:
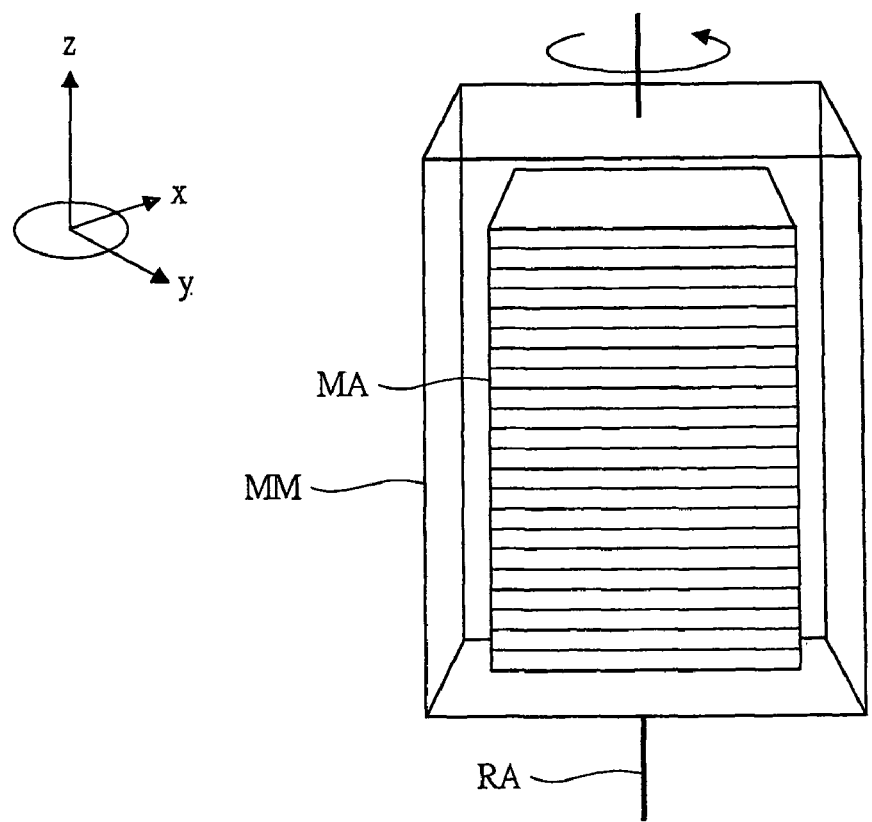
FIG. 3 is a diagram of the embodiment showing a material of the memory medium used in the present invention.
FIG. 4 is a diagram of an embodiment showing a reading method of an information memory device according to the present invention to which a principle of computer tomography is applied.

FIG. 3 shows examples of materials suitable to the embodiments of FIGS. 2B and 2C. The present embodiment is an embodiment of a material for the case where electromagnetic-wave absorption or emission by nuclear magnetic resonance is used in reading. A material for a portion except for the memory cell in the memory medium MM, i.e., "MM-BASE" can be configured by silicon (Si), tungsten (W), and the like that do not exhibit nuclear magnetic resonance. Silicon has advantages that it is a stable material and is therefore suitable for long-period storage, and also, is mass-marketed for integrated circuits and therefore is easily obtainable.

For the memory cell, an element that the number of either one of or both of neutrons or protons thereof are an odd number, for example, a material containing hydrogen (H), tantalum (Ta), silver (Ag), gold (Au), and the like can be used. These elements are not required to be used being a pure element, and the resonance phenomenon can be used even if they are used as compounds or mixtures thereof as they are only different in characteristics such as resonance frequency. Note that, when hydrogen is used for the memory cell, since gas thereof is difficult to be fixed at a position of the memory cell, it can be used by bonding with amorphous silicon. Nuclear magnetic resonance is a property of an element itself and this property itself does not deteriorate, and therefore is suitable for long-period storage of data.

Also, as a material configuring the memory cell, a material exhibiting, in addition to nuclear magnetic resonance at least one resonance phenomenon of electron spin resonance, ferromagnetic resonance, and anti-ferromagnetic resonance is preferable.

In this manner, as a material for the portion MM-BASE except for the memory cell in the memory medium MM, a material which is negligible in electromagnetic-wave absorption or emission, or a material whose electromagnetic-wave absorption or emission is small with respect to at least the memory cell is used, and a material which exhibits nuclear magnetic resonance is used with respect to the memory cell so that information can be stored by using the property of the element of the material itself configuring the memory cell, thereby enabling non-volatile information storage.

However, depending on a combination of materials which configure the memory cell and the memory medium, even they are solid, a case can be also considered where the material configuring the memory cell is diffused in the memory medium to pose a problem in reading. In this case, countermeasures are effective such as selecting a combination of materials whose diffusion coefficients are small, providing a barrier layer which prevents the diffusion at the memory-cell portion, and so on.

In addition, it is also possible that the memory medium MM is uniformly formed by using a material which is mixed with the material for the memory cell shown in FIG. 3 and causing thermal denaturation at the portion configuring the memory cell to write data. As a result of this thermal denaturation, as same with a so-called chemical shift, response characteristics of electromagnetic waves can be changed. As a matter of course, the element itself exhibiting nuclear magnetic resonance is not modified, but a surrounding molecular structure thereof or a local density of the element exhibiting nuclear magnetic resonance are changed, so that a relaxation time and intensity of an electromagnetic wave having a specific frequency in absorption or emission spectra can be modulated. Therefore, a same effect can be obtained as the case where a material of MM-BASE described above is different from a material of the memory cell. Note that, differing from Patent Document 2, the memory cell obtained by thermal denaturation is stable even if a magnetic field or the like is not provided externally, thereby storing in a non-volatile manner. In this case, the number of materials used for the memory medium MM can be only one, and while electromagnetic-wave absorption and emission are also performed in MM-BASE, a difference in electromagnetic-wave absorption and emission by the thermal denaturation can be obtained, thereby reading data.

Note that, to induce the local thermal denaturation as described above, a method of using electromagnetic-wave resonance absorption or a method of locally concentrating a strong electromagnetic wave such as a laser beam can be used. These methods will be described in an embodiment of FIG. 7 later, and are thus omitted here. When the electromagnetic wave is used, since permeability of materials is high, the selectable range of materials to be used for the memory medium MM can be wide. On the other hand, when a laser beam is used, the material for the memory medium MM is required to be a material which transmits laser beams, thereby decreasing the selection range of the material. However, by controlling a position of a lens which concentrates the laser beam, it is advantageous to enable writing at a required position so that writing is facilitated.

Figure 5:
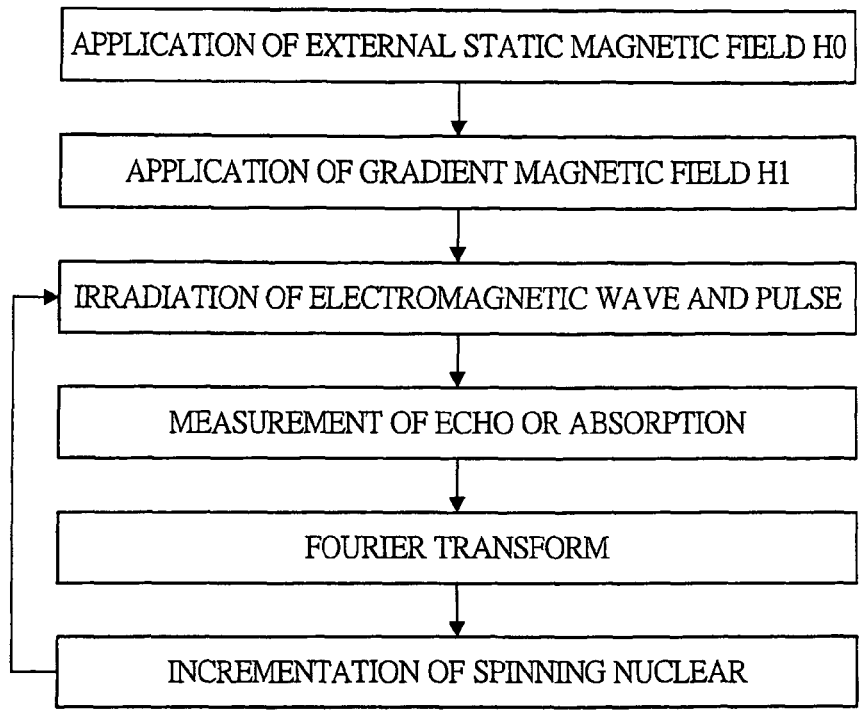
FIG. 5 is a diagram of an embodiment showing a procedure of the reading method of the information memory device according to the present invention in which the principle of computer tomography is applied.

In the following, an embodiment of reading data of a memory cell using nuclear magnetic resonance will be concretely described with reference to FIGS. 4 and 5. While the embodiment of FIG. 2C is assumed here, the principle is also same in FIG. 2B and others. Although theoretical details about nuclear magnetic resonance are omitted, they are described in, for example, Non-Patent Document 1 and others.

In the present invention, in a state to provide a constant magnetic field H0 and a gradient magnetic field H1 from the magnetic-field generator unit MFU to the memory medium MM, an electromagnetic wave is irradiated from the irradiating (sender) unit SU. In this state, the second material filling a small section where data '1' is stored exhibits nuclear magnetic resonance at a frequency proportional to a strength of the magnetic field at the position. By observing spectra of the irradiated electromagnetic wave absorption or spectra of the emitted electromagnetic wave after the absorption by the receiver unit RU, a position of a small section where a material corresponding to data '1' is present can be found. If an electromagnetic wave having a corresponding frequency is not absorbed in or emitted from a position to be the small section, data '0' is stored at that position.

When the gradient magnetic field applied from the magnetic-field generator unit MFU has a steep gradient so as to be distinguishable for three-dimensional space coordinates of the small section, a coordinate of the data '1' can be calculated directly from the spectra of the electromagnetic wave. For example, when 1000 pieces of memory cells are arranged at an equal distance "d" in each of X, Y, and Z directions, in order to provide different magnetic fields to each of the memory cells, space-coordinate dependence of a gradient magnetic field "H" is required to have a following dependence.

$$H(x, y, z)=1000000(z/d)+1000(Y/d)+x/d \ (X, Y, Z= 0 \text{ to } 999d) \tag{1}$$

By generating and maintaining such a three-dimensional gradient magnetic field with high accuracy, '1' or '0' can be determined for each of the memory cells that are arranged in three dimensions.

However, if the distance between the memory cells is made small, the three-dimensional gradient magnetic field is required to be generated and maintained with steep and high accuracy, and therefore an implementation thereof possibly becomes difficult. To solve this problem, there is a method such as one used in diagnostic imaging MRI (magnetic resonance imaging). That is, in a state where a gradient magnetic field in an z direction is provided, an electromagnetic-wave pulse is provided to cause a resonance at a memory cell on an x-y plane at a specific z value, and further, with providing gradient magnetic fields to x and y directions, a frequency and a phase of an emitted electromagnetic wave from the memory cell therein are modulated, so that a position in a selected plane is measured. According to this method, it is not necessary to generate a highly accurate three-dimensional gradient magnetic. However, since processing of received signal and repetition of the measurement are required, there is a possibility of lowering reading speed.

To solve these two problems above, a gradient which is distinguishable in two-dimensional coordinates among the three-dimensional coordinates of the small section is provided, and, from spectra obtained by gradually rotating the memory medium, coordinates of the memory cells on each of cross sections vertical to the rotational axis are calculated by computer tomography, thereby obtaining three-dimensional coordinates of all memory cells. In this manner, since the gradient magnetic field is generated in two dimensions, it is easier to increase accuracy than generating in three dimensions.

FIG. 4 is a diagram of an embodiment showing a rotation of a recording medium which is necessary for that manner described above, and FIG. 5 is a diagram of an embodiment showing a reading procedure. In FIG. 4, a gradient magnetic field having a dependence only in Z and X directions is provided. For example, as same with an example described above, when 1000 pieces of the memory cells are arranged so as to have an equal distance "d" in each of X, Y, and Z directions, a space-coordinate dependence of the gradient magnetic field H may be as follows.

$$H(x, z)=1000(Z/d)+X/d \ (X, Z=0 \text{ to } 999d) \tag{2}$$

And, an electromagnetic wave is irradiated from the Y direction. Then, spectra of the absorbed or emitted electromagnetic wave at this time are obtained using Fourier transform, and data are collected as gradually rotating about the z axis. A specific frequency component of an electromagnetic wave observed at a rotational angle θ obtained in this manner is an integration of intensities of the electromagnetic wave absorbed to or emitted from the memory cell, which are integrated in the y axis at the corresponding z-x coordinates, that is, in the irradiating direction of the electromagnetic wave. Here, by rotating the memory medium MM about the z axis, in each of cross sections vertical to the z axis, integral values in y-axis direction can be measured for one rotation. The integral values for one rotation are measured, and reverse Radon transform is performed to the values with a principle of computer tomography, thereby obtaining a distribution of the memory cells on a z-axis cross section. The principle of computer tomography is described in, for example, Non-Patent Document 2 and others.

Figure 6:
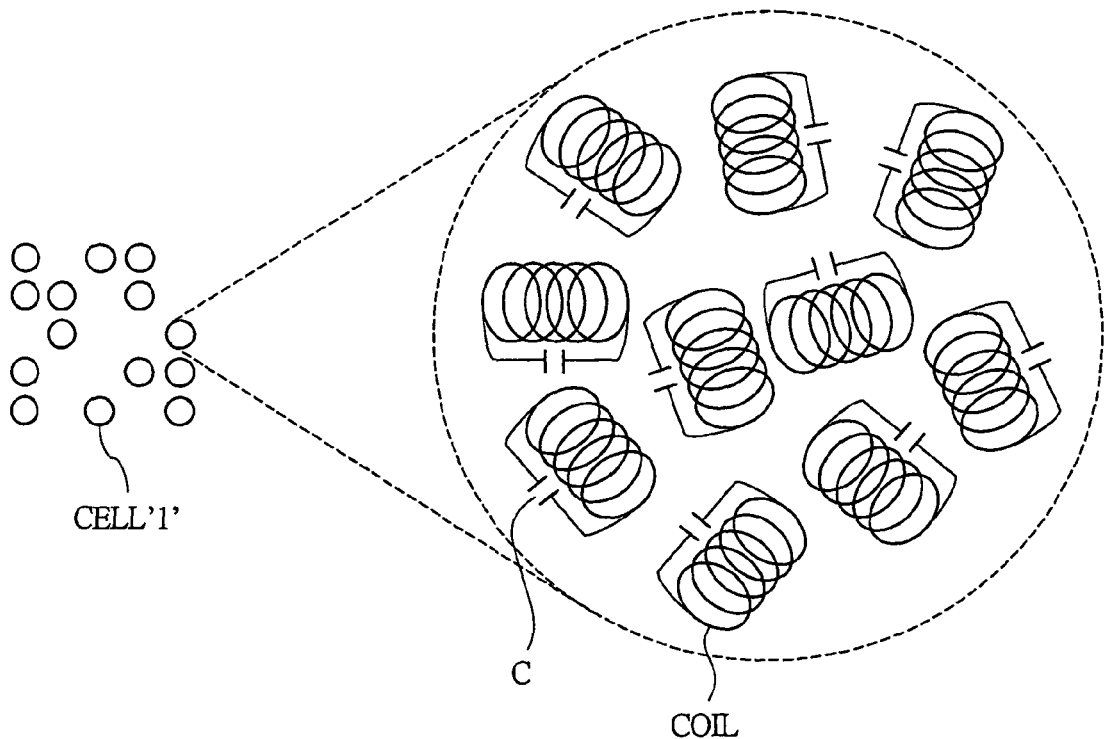
FIG. 6 is a diagram of an embodiment showing a configuration of a memory cell of the information memory device according to the present invention in which a resonance circuit using a fine coil is applied to the memory cell.

Note that, to obtain data with a high S/N ratio in nuclear magnetic resonance, as known well, a strong magnetic field is required to be applied to the memory medium MM. However, in some cases, generation of a strong magnetic field is difficult for reasons such as that an apparatus thereof is big or power consumption is high (in the case of an electromagnet). In such cases, an embodiment such as shown in FIG. 6 is effective.

In the present embodiment, a resonant circuit comprising a fine coil and a capacitor are enclosed in the memory cell portion. The fine resonant circuit can be formed of, for example, carbon. A manufacturing method thereof is described in, for example, Patent Document 3. Such a fine coil made of carbon is called a carbon microcoil, a carbon nanocoil, or the like, depending on its size. The resonance frequency with respect to the electromagnetic wave can be set in an optical region for a carbon nanocoil of a nanometer size, whilst in a high-frequency radio range for a carbon microcoil of a micrometer size, and the present invention can be applied according to the resonance frequency. The carbon nanocoil has been studied for an application to a lens with a negative index of refraction and the like, whilst the carbon microcoil is used as an electromagnetic-wave shielding member.

To apply the embodiment of FIG. 4 and the like, space dependence of the resonance frequency is required to be provided. In the fine coil formed of carbon, since a parasitic capacity by a dielectric surrounding the coil operates as a capacitor of the resonant circuit, by applying a gradient electric field in stead of a magnetic field, a space-coordinate dependence of the resonance frequency can be provided. Note that, in stead of applying a gradient electric field, a coil with a different winding number according to the space coordinates of the memory cell, or a filler to fix the coil which has a different magnetic permeability can be also used. In this manner, the gradient electric field is not required to be generated, thereby simplifying a configuration of a unit to generate an electric field.

By including the coil in the memory cell in this manner, it is advantageous to have no requirement of an external magnetic field from a special permanent magnet or an electromagnet that consumes a large current. Note that, as described above, the memory cell is three-dimensionally arranged in the memory area MA inside the memory medium MM.

Figure 7A:
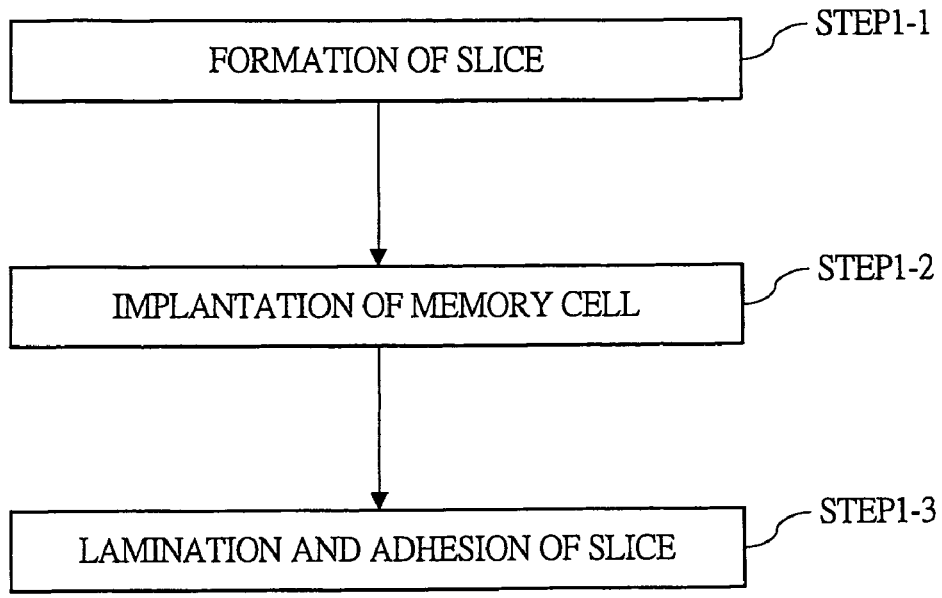
FIG. 7A is a diagram showing a method of manufacturing a memory medium "MM"

As for a manufacturing method of the memory medium MM in which the memory cells are three-dimensionally arranged, while various manufacturing methods are considered, a method among them which facilitates manufacturing is described with reference to FIGS. 7A and 7B. FIG. 7A shows a manufacturing method in a case that MM-BASE and the memory cell are formed of different materials. First, for example, a slice of a disc-shaped memory medium is previously prepared with a wafer made of silicon and the like (STEP 1-1). Next, a through hole is made at a desired position in the slice, and the memory-cell material shown in FIG. 3 is buried in the hole (STEP 1-2). Then, a plurality of the slices having the memory-cell material buried therein in STEP 1-2 are laminated and adhered, thereby being one memory medium MM (STEP 1-3). By manufacturing the memory medium MM in this manner, data can be written in each of the slices, and therefore, in mass production, a price thereof can be reduced.

Figure 7B:
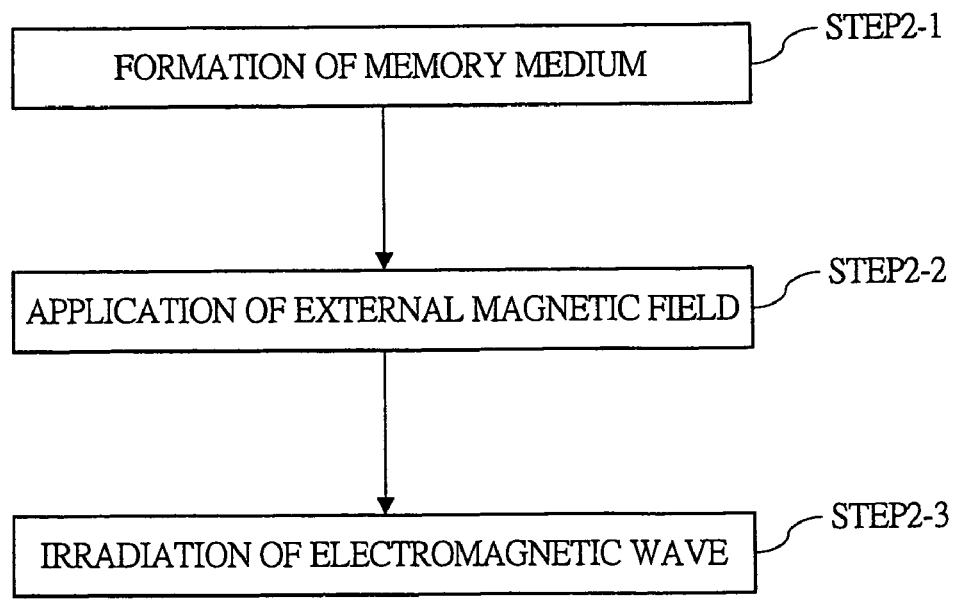
FIG. 7B is a diagram showing a method of manufacturing the memory medium "MM".

FIG. 7B shows a manufacturing method in a case that the memory cell is formed by thermal denaturation. First, using a material mixed with the material for the memory cell shown in FIG. 3, the memory medium MM is uniformly formed (STEP 2-1). Next, a resonance frequency in the memory area MA inside the memory medium MM is set to be varied in each of space coordinates by an external magnetic field (STEP 2-2). Then, in that state, a strong electromagnetic wave is irradiated having a resonance frequency of the memory cell where data are desired to be changed, (STEP 2-3). In this manner, thermal denaturation can be selectively induced at memory cells having the resonance frequency.

Note that, in stead of using an external magnetic field and an electromagnetic wave, thermal denaturation can also be induced by a laser beam irradiation. When an external magnetic field and an electromagnetic wave are used, since a permeability of materials is high, selectable range of materials to be used for the memory medium MM can be wide. On the other hand, when a laser beam is used, the material for the memory medium MM is required to be a material which transmits the laser beam, thereby decreasing the selectable range of the material. However, by controlling a position of a lens which concentrates the laser beam, it is possible to write at a required position, and therefore there is an advantage of facilitating writing.

In the forgoing, since data are three-dimensionally saved by adopting the present invention, compared with a two-dimensional memory such as a general semiconductor memory device, a highly-integrated memory without relying on microfabrication can be achieved. Also, differing from a method disclosed in Patent Document 2, since the memory cell is saved by a material different from that of the memory medium MM, even without an external magnetic field, data can be stored in a non-volatile way. Furthermore, since data is stored as being sealed in a solid-like medium, and is read in a non-contact way, the data can be stored for a long period. That is, if the memory medium is stored in a container that cuts off electromagnetic waves, the data will not be lost due to normal temperature or moisture. Even if a surface thereof gets scratched or erosion by mold or the like occurs, by polishing the part, reading information can be achieved. Therefore, an information memory device according to the present invention is suitable for storing valuable images, documents, and data of cultural assets as digital data for an extremely long period of time.

Currently, for long-period storage of books and documents, microfilm is mainly used. However, this is duplicated analog data, and besides, binary of black and white. An optical disc, a hard disk, a semiconductor memory, and the like, can store digital data in high density, however, their lifetime is much shorter than that of microfilm (it said that 500 years or longer). Consequently, the present invention has features of not only achieving high-density storage by three-dimensional storage but also being capable of storing digital data longer than ever.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. An information memory device, comprising:
a memory medium which has a first solid material and a plurality of small sections that are provided inside of the first solid material for storing data and each of the small section contains a second material;
a sender unit which irradiates an electromagnetic wave including a plurality of frequencies to the memory medium;
a receiver unit which receives electromagnetic waves emitted from the plurality of small sections upon reception of the electromagnetic wave irradiated from the sender unit; and
a processing unit which obtains data stored in the plurality of small sections and an address corresponding to the data from a spectrum of the electromagnetic wave received at the receiver unit, wherein
the second material exhibits a resonance with at least one resonance frequency of the plurality of frequencies of the electromagnetic wave irradiated from the sender unit,
the second material contains a material that exhibits at least one resonance phenomenon of nuclear magnetic resonance, electron spin resonance, ferromagnetic resonance, and anti-ferromagnetic resonance, and
the first material is more prone to transmit the resonance frequency than the second material.

2. The information memory device according to claim 1, further comprising a magnetic-field generating unit for providing a magnetic field to the memory medium, wherein
the second material contains any one of amorphous silicon bonded with hydrogen, tantalum, silver, and gold,
the magnetic-field generating unit sets a resonance frequency depending on space coordinates to the second material forming the small section by applying a constant magnetic field and a gradient magnetic field having a space-coordinate dependence to the memory medium, and
the processing unit which relates data to an address by using magnitude of the resonance frequency.

3. The information memory device according to claim 1, wherein
the second material contains a plurality of coils which comprise a metal or a carbon.

4. The information memory device according to claim 3, wherein
the coil contained in the second material configuring the small section has different shapes or magnetic permeabilities of a filler that fixes the coil according to space coordinates,
the sender unit which irradiates an electromagnetic wave having a resonance frequency depending on the space coordinates to the small section, and
the processing unit obtains an address by using a magnitude of the resonance frequency.

5. A memory medium, comprising:
a first solid material; and
a plurality of small sections that are provided inside of the first solid material for storing data and each of the small sections contains a second material, wherein
the second material exhibits a resonance with at least one resonance frequency of an electromagnetic wave irradiated from the external,
the second material contains a material that exhibits at least one resonance phenomenon of nuclear magnetic resonance, electron spin resonance, ferromagnetic resonance, and anti-ferromagnetic resonance, and
the first material is more prone to transmit the resonance frequency than the second material.

6. The memory medium according to claim 5, wherein
the second material contains a plurality of coils which comprise a metal or a carbon.

7. The memory medium according to claim 6, wherein
the coil contained in the second material configuring the small section has different shapes or magnetic permeabilities of a filler that fixes the coil according to space coordinates.

* * * * *